United States Patent
Lee et al.

(10) Patent No.: US 8,253,672 B2
(45) Date of Patent: Aug. 28, 2012

(54) CIRCUIT BOARD AND DISPLAY DEVICE INCLUDING THE SAME

(75) Inventors: Sung-Kyu Lee, Suwon-si (KR); On-Sik Choi, Seongnam-si (KR); Do-Wan Kim, Hwaseong-si (KR); Sung-Wook Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1058 days.

(21) Appl. No.: 12/186,348

(22) Filed: Aug. 5, 2008

(65) Prior Publication Data

US 2009/0184910 A1    Jul. 23, 2009

(30) Foreign Application Priority Data

Jan. 18, 2008   (KR) .................. 10-2008-0005886

(51) Int. Cl.
*H01L 23/04* (2006.01)

(52) U.S. Cl. .................... 345/92; 257/678; 257/679

(58) Field of Classification Search .................. 174/255, 174/262
See application file for complete search history.

(56) References Cited

U.S. PATENT DOCUMENTS 6,924,552 B2 *   8/2005   Baukus et al. ................ 257/698

* cited by examiner

*Primary Examiner* — Amare Mengistu
*Assistant Examiner* — Shawna Stepp Jones
(74) *Attorney, Agent, or Firm* — Innovation Counsel LLP (57) ABSTRACT

One or more embodiments of the present disclosure relate to a circuit board having a substrate and a plurality of differential signal lines formed on the substrate and transmitting differential signals. The differential signal lines include a first signal line and a second signal line. The first signal line and the second signal line extend along at least two paths that are parallel to each other. The paths of the first signal line and the second signal line switch at path change portions, and the path change portions of neighboring differential signal lines are positioned at different distances away from an edge of the circuit board along the length direction of the differential signal line.

10 Claims, 10 Drawing Sheets

CIRCUIT BOARD AND DISPLAY DEVICE INCLUDING THE SAME

CROSS-REFERENCE TO RELATED APPLICATIONS

This application claims priority to and the benefit of Korean Patent Application No. 10-2008-0005886, filed in the Korean Intellectual Property Office on Jan. 18, 2008, the entire contents of which are incorporated herein by reference.

BACKGROUND

1. Technical Field

The present invention relates to a circuit board and a display device including the same and, in particular, to a circuit board including differential signal lines and a display device including the same.

2. Description of Related Art

Flat panel displays, such as a liquid crystal display (LCD), a plasma display device (PDP), a field emission display (FED), a vacuum fluorescent display (VFD), and an organic light emitting display (OLED) are widely used.

These display devices generally include a display panel and a signal controller for supplying signals to the display panel. The display panel receives the signals through a flexible printed circuit film connected to the signal controller. The signal controller includes a TCON (timing controller) and an IC chip (integrated circuit chip), and they are connected to wirings that are arranged at the same layer or at a different layer. The flexible printed circuit film includes a film, a plurality of wirings arranged parallel to each other on the film, and a passivation layer formed on the wirings.

The essential semiconductors, such as the TCON and the IC chip, have become complicated due to an increase in size and display quality of the display devices. Accordingly, resolution of various technical problems is required, and particularly, an improvement of a data transmission method is strongly required to prevent the deterioration of the display quality due to noise and signal delay.

For example, the signal transmission speed is low, the consumption of current is large, and EMI (electromagnetic interference) characteristic are poor in the case of a TTL (transistor-to-transistor logic) as a data transmission method between an LDI (LCD driver IC) and the conventional TCON. There are LVDS (low voltage differential signaling) and RSDS (reduced signal differential signaling) as methods to compensate this, and the EMI characteristic is improved by reducing the swing size of the signal in the conventional TTL method and the transmission speed of the signal is improved. Also, a smaller amount of wiring than in the conventional TTL method may be used. Recently, interface techniques, such as mini-LVDS and PPDS (point-to-point differential signaling), have been researched.

However, while the EMI characteristic may be improved in the low frequency band with the LVDS or RSDS methods, the EMI characteristic is not improved at a high frequency. If the high frequency region of 800 MHz to 6 GHz is used, in the case of a wireless wide area network and a wireless local area network, the EMI characteristic is not improved in this frequency region even if though the LVDS or the RSDS are used. To improve the display quality of the display device, the EMI should be reduced.

SUMMARY

A circuit board, according to an exemplary embodiment of the present disclosure, includes a substrate and a plurality of differential signal lines formed on the substrate and transmitting differential signals. The differential signal lines, respectively, include a first signal line and a second signal line. The first signal line and the second signal line extend along at least two paths parallel to each other. The paths of the first signal line and the second signal line are changed at a path change portion. Path change portions of neighboring differential signal lines are positioned at different distances away from an edge of the circuit board along a length direction of the differential signal lines.

In various implementations, the substrate may include a first surface and a second surface. The paths may include a first path disposed on the first surface and a second path disposed on the second surface. One side of the first signal line may be disposed on the first path and the other side of the first signal line may be disposed on the second path with respect to the path change portion. The second signal line may be disposed to avoid overlapping the first signal line outside the path change portions.

In various implementations, the substrate may include a pair of via holes disposed at the path change portion, and the first signal line and the second signal line may be changed from the first path to the second path through the via holes. The first path and the second path may overlap each other. The via holes may be separated from the first path and the second path. The pair of via holes may be separated and on opposite sides with reference to the first and second paths.

In various implementations, the portion of the first signal line and the portion of the second signal line disposed at the path change portion may form a substantially rhombic outline. The first path is on the second surface of the substrate, and the first path and the second path may be separated by a predetermined interval. The via holes may be respectively disposed on the first path and the second path, and the first signal line and the second signal line may be crossed in the path change portion. The portion of the first signal line and the portion of the second signal line disposed on the path change portion may form a cross. The path change portion of every other differential signal line may be located a same distance away from an edge of the circuit board to thereby form a staggered arrangement of the path change portion.

The path change portion of the differential signal line is located on the central portion between two adjacent path change portions of the neighboring differential signal line.

In various implementations, the substrate may include the first surface and the second surface, and a plurality of via holes separated from the path change portion in a length direction of the differential signal line. The paths may include a first path disposed on the first surface, a second path disposed on the second surface and overlapping the first path, a third path disposed on the first surface and at an interval from the first path, and a fourth path disposed on the second surface and overlapping the third path. The first signal line may switch from the first path to the third path in the path change portion and may be changed from the third path to the fourth path in the via hole. The second signal line positioned in the section corresponding to the first signal line may switch from the fourth path to the second path in the path change portion and may be changed from the second path to the first path in the via hole. The first signal line and the second signal line may cross each other in the path change portion, and the portion of the first signal line and the portion of the second signal line disposed in the path change portion may form a cross. The via holes corresponding to two neighboring differential signal lines on the same plane of the substrate may be positioned in different portions along the length of the differential signal line. The path change portions and the via holes corresponding to two neighboring differential signal lines on the same plane of the substrate may be positioned at different portions along the length of the differential signal line.

In various implementations, the substrate may be formed as a dual-layered structure having an upper layer and a lower layer. The path may include a first path disposed on the upper layer and a second path disposed on the lower layer. One portion of the first signal line may be disposed in the first path and the other portion of the first signal line may be disposed in the second path. The second signal line is disposed on a different path than the first signal line outside the path change portion. The upper layer may include a pair of via holes disposed in the path change portion, and the paths of the first and second signal lines may switch between the upper layer and the lower layer through the via holes. The substrate and the differential signal lines may be flexible.

A display device, according to an exemplary embodiment of the present disclosure, includes a circuit board having a substrate and a plurality of differential signal lines formed on the substrate and transmitting differential signals. The display device includes a gate and data driving IC chips receiving signals from the circuit board. The display device includes a display panel including a plurality of thin film element structures on a substrate. The display panel may receive the signals from the gate and data driving IC chips. The differential signal lines respectively include a first signal line and a second signal line. The first signal line and the second signal line extend along at least two paths that are parallel to each other. The paths of the first signal line and the second signal line switch at path change portions. Path change portions of neighboring differential signal lines are positioned at the different portions along the length direction of the differential signal lines According to an exemplary embodiment of the present disclosure, the EMI may be reduced in the high frequency band as well as in the low frequency band. Moreover, the deterioration of the display quality of the display device due to the noise, such as EMI, may be prevented.

BRIEF DESCRIPTION OF THE DRAWINGS

One or more exemplary embodiments of the present disclosure will be described in detail with reference to the accompanying drawings for understanding of advantages of the present disclosure, wherein.

DETAILED DESCRIPTION OF EMBODIMENTS

The present disclosure will be described in greater detail herein with reference to the accompanying drawings, in which exemplary embodiments of the disclosure are shown. As those skilled in the art should understand, the described embodiments may be modified in various different ways, all without departing from the spirit or scope of the present disclosure. A flexible printed circuit film according to an exemplary embodiment of the present disclosure may be applied to various display devices, such as a liquid crystal display, a plasma display device, a field emission display, a florescent display panel, and an organic light emitting device. In the accompanying drawings, a liquid crystal display is shown, and an exemplary embodiment of the present disclosure is described based thereon, but a display device according to an exemplary embodiment of the present disclosure is not limited by the liquid crystal display.

In the drawings, the thickness of layers, films, panels, regions, etc., are exaggerated for clarity. Like reference numerals designate like elements throughout the specification. It will be understood that when an element, such as a layer, film, region, or substrate is referred to as being "on" another element, it can be directly on the other element or intervening elements may also be present. In contrast, when an element is referred to as being "directly on" another element, there are no intervening elements present.

A circuit board and a display device according to an exemplary embodiment of the present disclosure will be described in detail with the reference to FIGS. 1 to 4.

Figure 1:
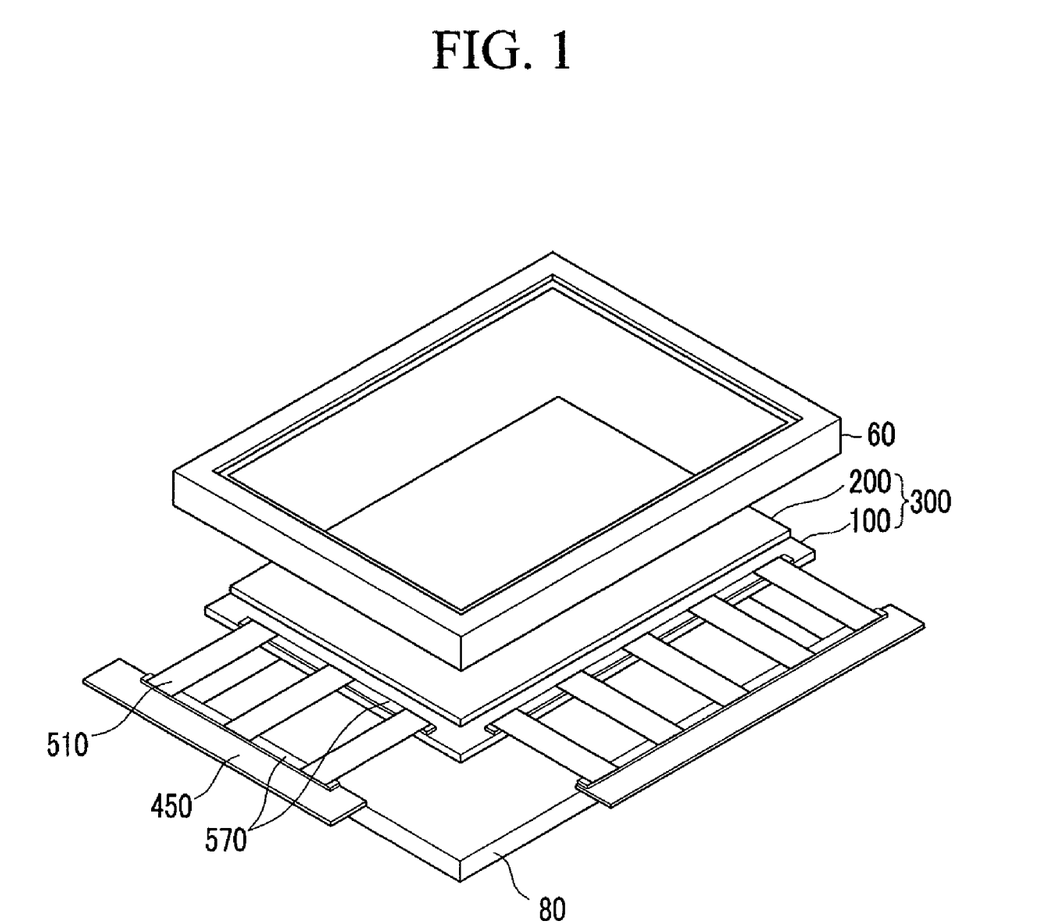
FIG. 1 is a perspective view of a display device according to an exemplary embodiment of the present disclosure.
Figure 2:
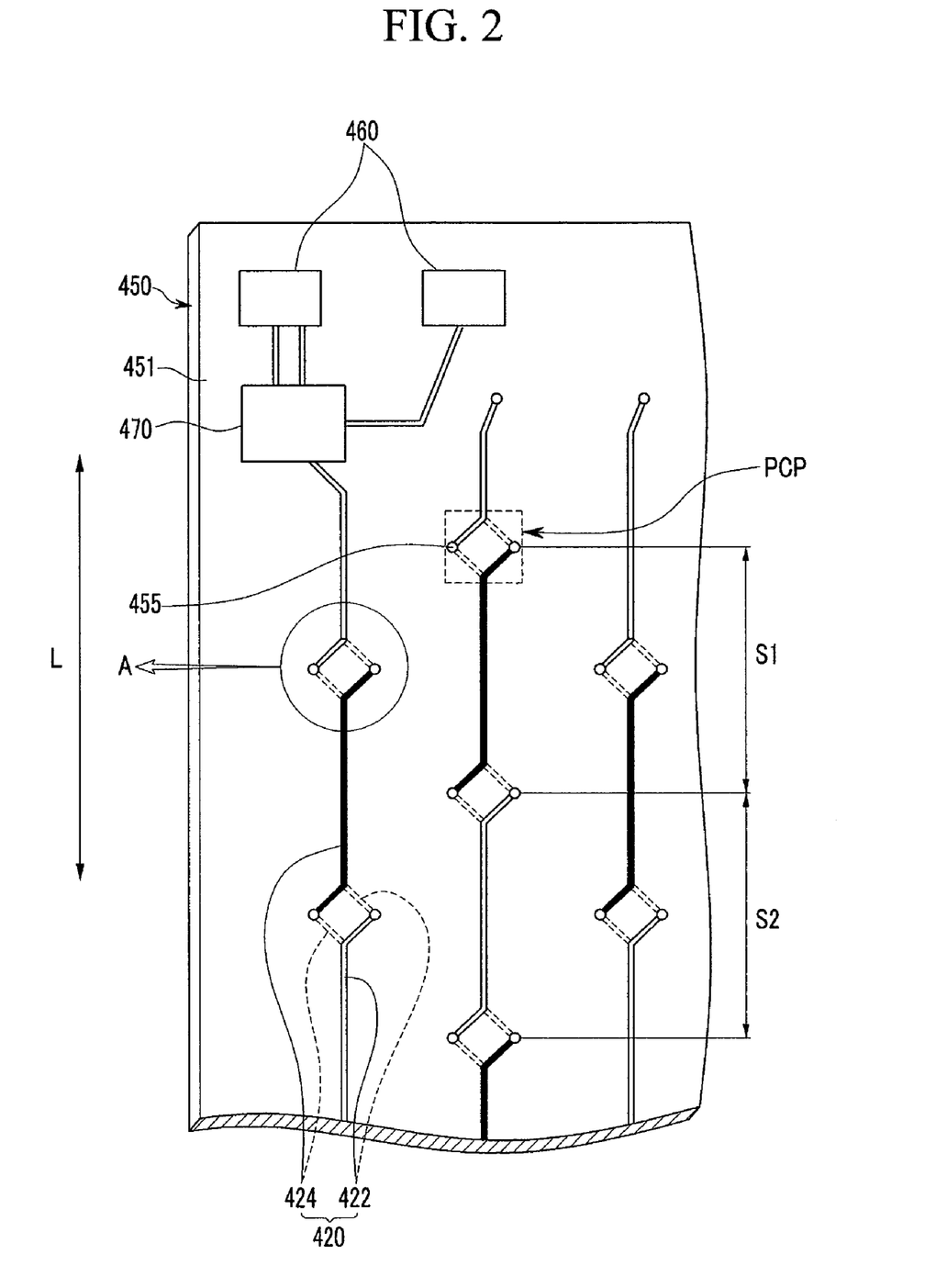
FIG. 2 is a top plan view of an enlarged portion of the circuit board of FIG. 1.
Figure 3:
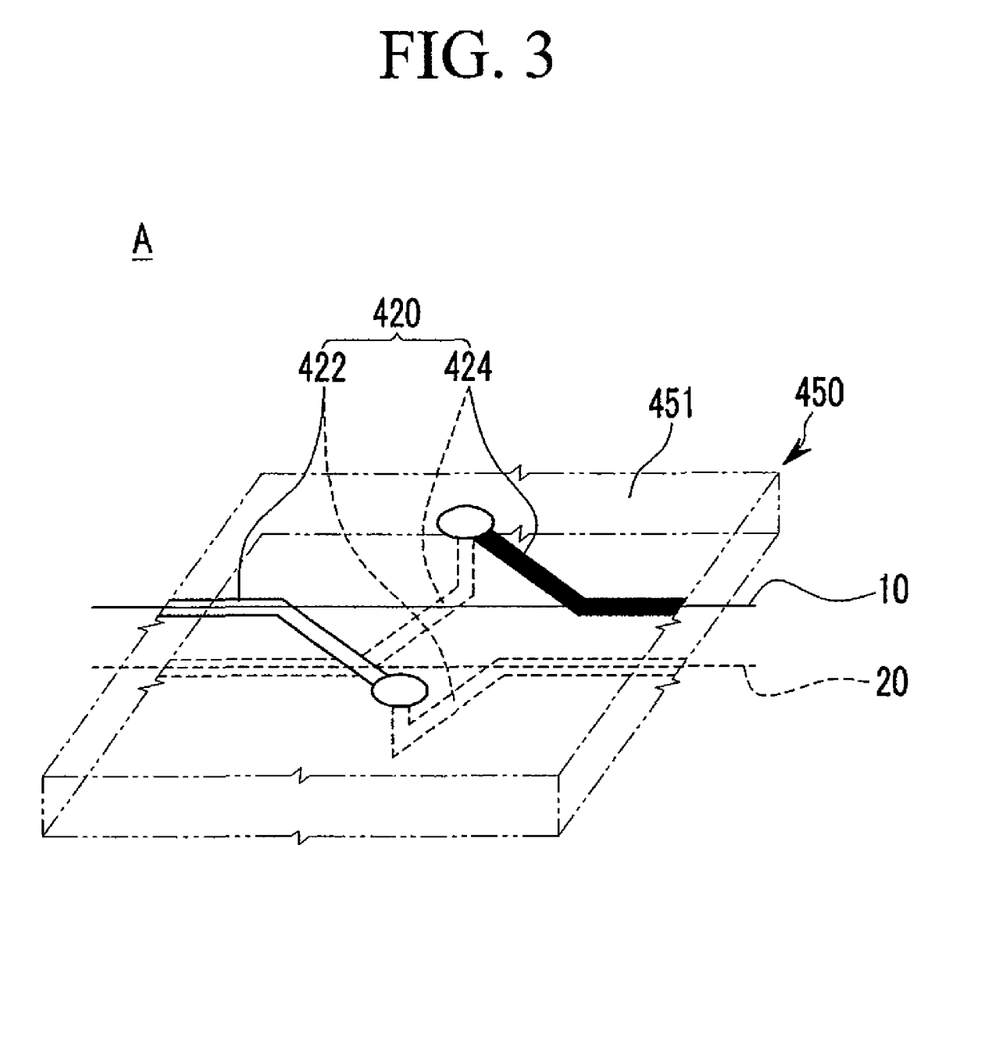
FIG. 3 is an enlarged view of an A portion of FIG. 2.
Figure 4:
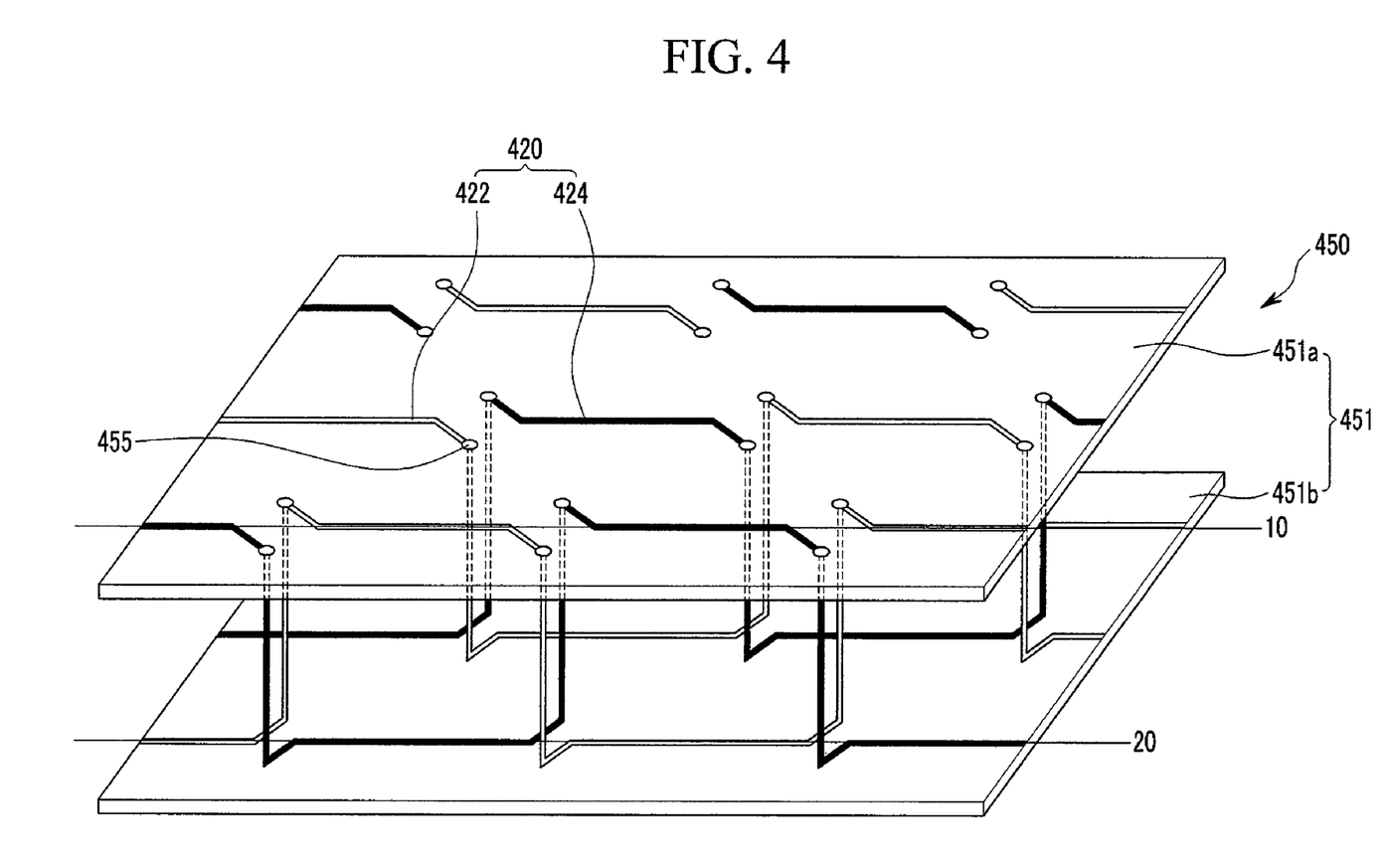
FIG. 4 is an exploded perspective view of a circuit board according to another exemplary embodiment of the present disclosure.

FIG. 1 is a perspective view of a display device according to an exemplary embodiment of the present disclosure. FIG. 2 is a top plan view of an enlarged portion of the circuit board shown in FIG. 1. FIG. 3 is an enlarged view of an A portion of FIG. 2. FIG. 4 is an exploded perspective view of a circuit board according to another exemplary embodiment of the present disclosure.

Referring to FIG. 1, a display device according to the present exemplary embodiment includes a display panel unit 300, a flexible printed circuit film 510, and a circuit board 450.

The display panel unit 300, in one embodiment, includes a lower panel 100, an upper panel 200, and an electro-optical active layer (not shown). However, the display panel unit 300 may include only one display panel, or more than three display panels.

The lower panel 100, in one embodiment, includes a substrate and thin film element structures thereon. The substrate is made of a transparent insulating material, such as glass or plastic. The thin film element structures include pixel electrodes, thin film transistors, and various signal lines, and they are made of conductors and insulating materials. Although not shown in the drawings, one example of the lower panel 100 will be simply described.

A plurality of gate lines are formed on a lower substrate. A gate insulating layer, semiconductors, and ohmic contacts are sequentially formed on the gate lines, and data lines and drain electrodes are formed thereon. The gate lines include a plurality of gate electrodes, the data lines include a plurality of source electrodes, and a gate electrode, a semiconductor, a source electrode, and a drain electrode form a thin film transistor. A passivation layer is formed on the semiconductors, the data lines, the drain electrodes, and the gate insulating layer, and a plurality of pixel electrodes are formed on the passivation layer. The pixel electrodes are connected to the drain electrodes through contact holes formed in the passivation layer.

The upper panel 200 is opposite to the lower panel 100 and is smaller than the lower panel 100 such that an edge portion of the lower panel 100 is not covered by the upper panel 200 and is exposed. The upper panel 200 includes a substrate and thin film structures. The substrate is made of a transparent insulating material such as glass or plastic. The thin film structures include a common electrode, color filters, and a light blocking member, and they are made of conductors and insulating materials. Although not shown in the drawings, one example of the upper panel 200 will be simply described.

A light blocking member is formed on the substrate. The light blocking member includes a plurality of openings facing the pixel electrodes and having almost the same shape as the pixel electrodes, and it blocks light leakage between the pixel electrodes. An overcoat is formed on the substrate and the light blocking member, and the common electrode is formed on the overcoat. The plurality of color filters are formed on the substrate and the passivation layer. Most of each color filter is formed in the openings of the light blocking member, and may display one of the primary colors such as three primary colors of red, green, and blue.

The above-described structure of the lower panel 100 and the upper panel 200 is only one example, and may be variously modified. For example, at least one of the common electrode, the color filters, and the light blocking member may be formed on the lower panel 100. Also, the lower panel 100 may include a storage electrode.

In one implementation, the electro-optical active layer is disposed between the lower panel 100 and the upper panel 200, when the display panel unit 300 includes one display panel, the electro-optical active layer is disposed on the display panel. The material of the electro-optical active layer is changed according to the kind of display device, and for example may be a liquid crystal material in the case of the liquid crystal display, and may be an organic light emitting material in the case of an organic light emitting display.

In one implementation, the circuit board 450 outputs a plurality of image signals, data signals, and gate signals through a gate driver IC chip and a data driver IC chip. The signals transmitted to the gate driver IC chip and the data driver IC chip are transmitted as a type of differential signal. An LVDS, an RSDS, a mini-LVDS, and a PPDS may be used for the differential signal transmission. The circuit board 450 will be described in detail with reference to FIGS. 2 and 3.

The flexible printed circuit film 510, in one embodiment, may include a film, metal wirings formed on the film, and a passivation layer formed on the metal wirings. One end portion of the flexible printed circuit film 510 is attached to the exposed edge portion of the lower panel 100 through a conductive adhesive 570, and the other end portion thereof is attached to the circuit board 450 through a conductive adhesive 570. In various implementations, the conductive adhesive 570 is one type of an anisotropic conductive film, and metal wirings formed in the flexible printed circuit film 510 are electrically connected to the wirings of the lower panel 100 and the circuit board 450 through conductive particles therein.

The gate/data driver IC chip may be formed on the flexible printed circuit film 510 (TCP type) or may be formed on the display panel unit 300 (COG/FOG type). The signals transmitted from the circuit board 450 are transmitted to the gate/data driver IC chips through the metal wirings of the flexible printed circuit film 510. The gate driver IC chip applies the gate-on voltage to the gate lines to turn on the switching elements connected to the gate lines, and the data driver IC chip selects a gray voltage corresponding to each digital image signal to convert the digital image signal into an analog data voltage, thereby applying them to the data line.

A light source unit 80, in one embodiment, is disposed under the display panel unit 300, and a cover 60 is disposed on the display panel unit 300. The light unit 80 may be stably fixed to the display panel unit 300 by using the cover 60.

The lighting unit 80, in one embodiment, may include a light source of a fluorescent lamp such as a cold cathode fluorescent lamp (CCFL) or an external electrode fluorescent lamp (EEFL), a light emitting diode (LED) and so on, and a light guide and a reflection member. The light guide guides the light irradiated from the light source, and the reflection member reflects the reflected light from the light guide toward the direction of the display panel unit 300 to minimize the light loss.

Referring to FIGS. 2 and 3, the circuit board 450 includes a substrate 451, a plurality of IC chips 460, a TCON 470, and a plurality of differential signal lines 420.

The substrate 451, in one embodiment, may be made of phenolic resin or epoxy resin so that the substrate 451 may be flexible to bend. The IC chip 460 for a graphics process and the TCON 470 for converting the signals input from the IC chip 460 into the various control signals to drive the gate/data driver IC chips are formed on the substrate 451.

A plurality of differential signal lines 420, in one embodiment, are formed on the substrate 451. One differential signal line 420 includes a first signal line 422 and a second signal line 424. The first signal line 422 and the second signal line 424 respectively include a portion disposed on a first path 10 and a portion disposed on a second path 20, and transmit signals having the same amplitude and opposite phases. First path 10 and second path 20 are both shown to be straight in the embodiments herein. In this case, the receiving circuit reacts to the voltage difference between the two signal lines 422 and 424. Here, the first path 10 is disposed on the upper surface of the substrate 451 and the second path 20 is disposed on the lower surface of the substrate 451, and when the first path 10 is projected to the lower surface of the substrate 451 on which the second path 20 is disposed, the two paths 10 and 20 are overlapped.

A plurality of via holes 455, in one embodiment, are formed in the substrate 451, and the via holes 455 are disposed in pairs in a path change portion PCP. The pair of via holes 455 are separated from each other and bend in opposite directions with reference to the paths 10 and 20. The path change portion PCP is the portion where the paths of the first and second signal lines 422 and 424 are changed, and is repeatedly disposed along the length direction L of the differential signal line 420. When the sections between two neighboring via holes 455 along the length direction L of the differential signal line 420 are referred to as S1 and S2, the distance of the sections S1 and S2 may all be the same or may be different for each section.

In one implementation, the first signal line 422 is disposed on the first path 10 and the second path 20 in an alternating manner along the length direction L. When tracing the second signal line 424 along the length direction L, the second signal line 424 is disposed on the first path 10 and the second path 20 in an alternating manner. In the sections S1 and S2, the first signal line 422 and the second signal line 424 are disposed on the paths of opposite sides. As such, the second signal line 424 is disposed on the second path 20 in the section where the first signal line 422 is disposed in the first path 10, and the second signal line 424 is disposed on the first path 10 in the section where the first signal line 422 is disposed in the second path 20. The positions of the first signal line 422 and the second signal line 424 are changed to the first path 10 or the second path 20 through the via hole 455.

If the positions of the first and second signal lines 422 and 424 are described in detail along the direction L from the first section S1 to the second section S2, the position of the first signal line 422 switches from the first path 10 to the second path 20 through the via hole 455 disposed where the first section S1 starts, and the first signal line 422 extends along the second path 20 to the via hole 455 disposed at the end of the first section S1. Next, the position of the first signal line 422 switches to the first path 10 through the via hole 455 disposed where the first section S1 ends and the second section S2 starts, and the first signal line 422 extends along the first path 10 to the via hole 455 disposed at the end of the second section S2.

The position of the second signal line 424 switches from the second path 20 to the first path 10 through the via hole 455 disposed where the first section S1 starts, and next the second signal line 424 extends along the first path 10 to the via hole 455 disposed at the end of the first section S1. The position of the second signal line 424 again switches to the second path 20 through the via hole 455 disposed where the first section S1 ends and the second section S2 starts, and the second signal line 424 extends along the second path 20 to the via hole 455 disposed at the end of the second section S2.

The first signal line 422 and the second signal line 424 are almost overlapped along their length direction, but are not overlapped on the path change portion PCP. As such, the first and second signal lines 422 and 424 bend away from the paths 10 and 20 in opposite direction from each other with reference to the paths 10 and 20 in the path change portion PCP, and their positions are changed through the via holes 455 disposed apart from the paths 10 and 20. The first and second signal lines 422 and 424 of which positions are exchanged again become close to the paths 10 and 20 and extend along the paths 10 and 20. The plane view shapes of the portions of the first signal line 422 and the second signal line 424 that are disposed in the path change portion PCP are approximately rhomboidal or rectangular.

The path change portions PCP of different differential signal lines 420 are disposed at different distances away from an edge of the circuit board 450 along the length directions. For example, the path change portion PCP of the leftmost differential signal line 420 that is indicated by "A" in FIG. 2 may be the same distance away from an edge of the circuit board 450 as the rightmost differential signal line 420 in the first section S1. In the particular example shown in FIG. 2, the path change portions PCP of the different differential signal lines are positioned in a staggered manner so that no two path change portions PCP are too close to each other. If the path change portion PCP of the neighboring differential signal line 420 and the via hole 455 do not cross and are disposed in a line, the path change portion PCP and the via holes 455 would function as an antenna and deteriorate the EMI characteristic.

On the other hand, as shown in FIG. 4, the substrate 451 may have a dual-layered structure including an upper layer 451a and a lower layer 451b. In this case, the first path 10 is disposed at the upper layer 451a and the second path 20 is disposed at the lower layer 451b. A plurality of via holes 455 are formed on the upper layer 451a. The remaining structure is almost the same as the structure shown in FIGS. 2 and 3.

Next, a circuit board according to another exemplary embodiment of the present disclosure will be described in detail with reference to FIGS. 5 to 7. The circuit board according to the present exemplary embodiment may be applied to another display device using a circuit board as well as the above-described display device.

Figure 5:
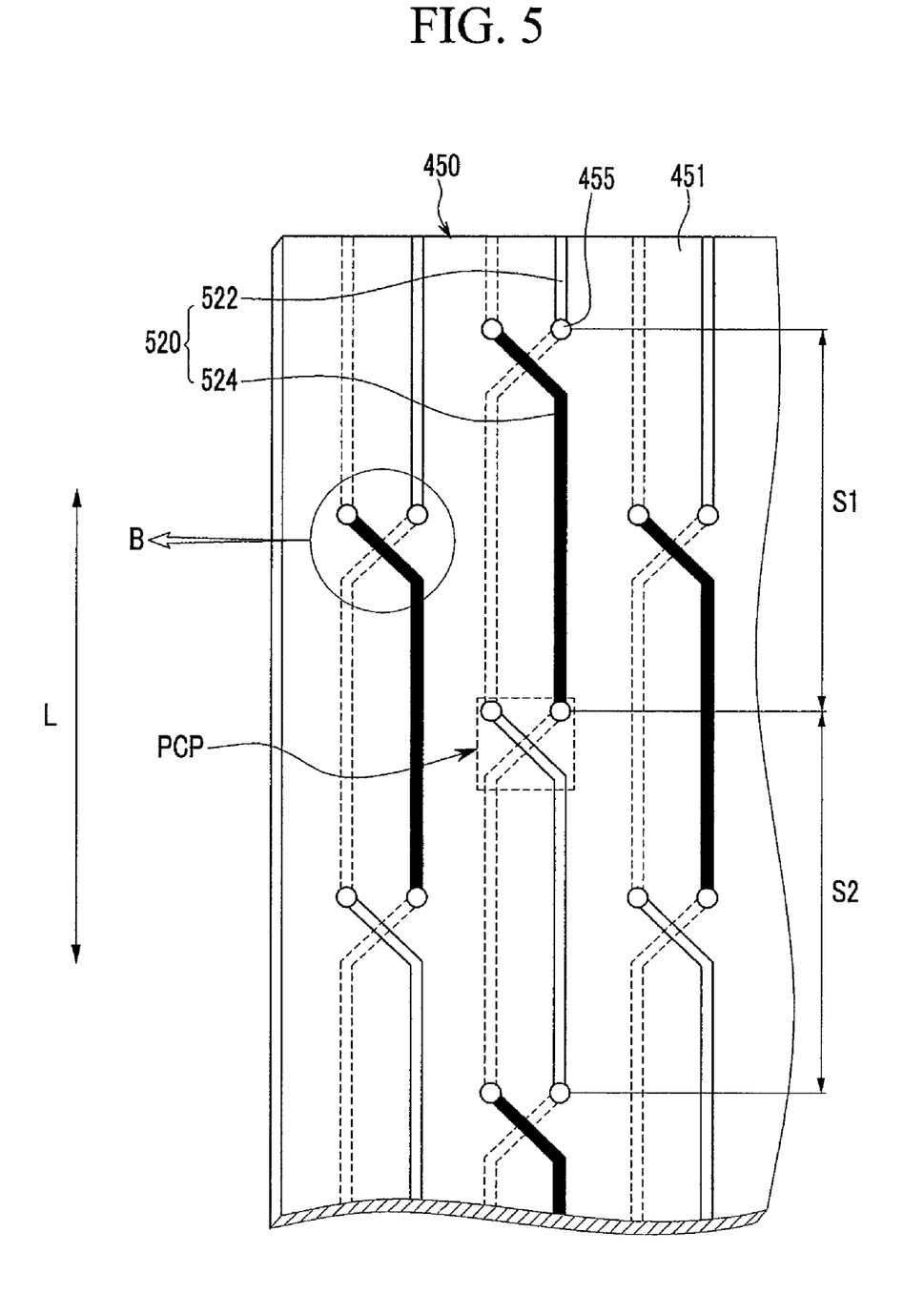
FIG. 5 is a top plan view of an enlarged portion of a circuit board according to another exemplary embodiment of the present disclosure.

FIG. 5 is a top plan view of an enlarged portion of a circuit board according to another exemplary embodiment of the present disclosure. FIG. 6 is an enlarged view of B portion of FIG. 5. FIG. 7 is an exploded perspective view of a circuit board according to another exemplary embodiment of the present disclosure.

Figure 6:
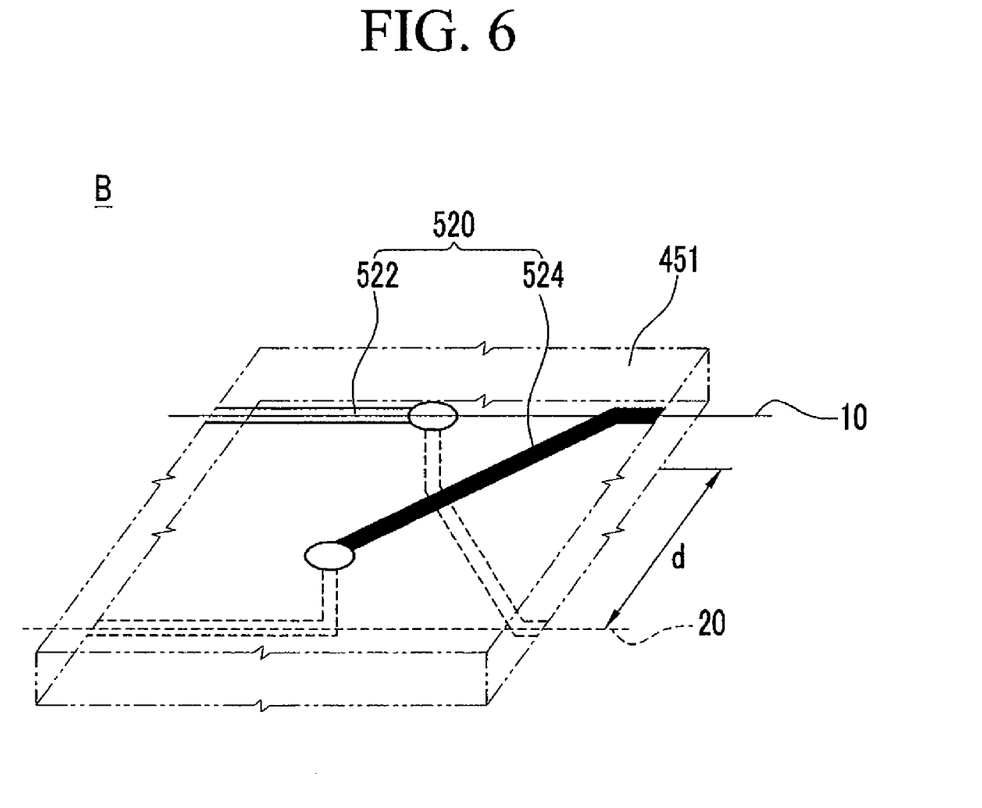
FIG. 6 is an enlarged view of a B portion of FIG. 5.

Referring to FIGS. 5 and 6, a circuit board 450 includes a substrate 451 and a plurality of differential signal lines 520.

The substrate 451, in one embodiment, may be formed of phenolic resin or epoxy resin and may be flexible to allow the substrate 451 to move and bend. The substrate 451 may be made of a single-layered structure. A plurality of differential signal lines 520 are formed on the substrate 451. One differential signal line 520 includes a first signal line 522 and a second signal line 524. Each of the first signal line 522 and the second signal line 524 includes portions disposed on the first path 10 and portions disposed on the second path 20, and transmits signals having the same amplitude and opposite phases. Here, the first path 10 is disposed on the upper surface of the substrate 451, and the second path 20 is disposed on the lower surface of the substrate 451. When the first path 10 is disposed on the lower surface of the substrate 451 on which the second path 20 is disposed, the two paths 10 and 20 do not overlap and are separated from each other.

The substrate 451, in one embodiment, includes a plurality of via holes 455 disposed along the two paths 10 and 20. The via holes 455 are disposed as pairs on the path change portion PCP where the first and second signal lines 522 and 524 are crossed to thereby change the paths. The path change portion PCP is repeatedly disposed along the length direction L of the differential signal line 520.

In one implementation, when the interval between two neighboring via holes 455 along the length direction L of the differential signal line 520 is referred to as sections S1 and S2, the distance of the sections S1 and S2 may all be the same or may be different for each section.

In one implementation, when tracing the first signal line 522 along the length direction L, it has a portion disposed on the first path 10 and a portion disposed on the second path 20 alternating with each other. When tracing the second signal line 524 along the length direction L, the portion disposed on the first path 10 and the portion disposed on the second path 20 alternate. In the same sections S1 and S2, the first signal line 522 and the second signal line 524 are disposed on paths on opposite sides. The first signal line 522 and the second signal line 524 are moved into the upper surface and the lower surface of the substrate 451 through the via holes 455, and cross each other to thereby change the paths 10 and 20. The plan view shape of the portion at which the first signal line 522 and the second signal line 524 overlap may be a cross.

If the position of the first and second signal lines 522 and 524 is described in detail along the direction from the first section S1 to the second section S2, the first signal line 522, in one embodiment, is traced from the first path 10 to the lower surface of the substrate 451 through the via hole 455 disposed at the position where the first section S1 starts, curves toward the second path 20, and extends to the via hole 455 disposed at the end of the first section S1 along the second path 20. The first signal line 522 is again traced on the upper surface of the substrate 451 in the second path 20 through the via hole 455 disposed at the portion where the first section S1 ends and the second section S2 starts, is next bent toward the first path 10, and extends to the via hole 455 disposed at the end of the second section S2 along the first path 10.

The second signal line 524, in one embodiment, is traced from the second path 20 to the upper surface of the substrate 451 through the via hole 455 disposed at the portion where the first section S1 is started, is then curved toward the first path 10, and is extended along the first path 10 to the via hole 455 disposed at the end of the first section S1. The second signal line 524 is again traced from the first path 10 to the lower surface of the substrate 451 through the via hole 455 disposed at the portion where the first section S1 is ended and the second section S2 is started, is then bent toward the second path 20, and is extended along the second path 20 to the via hole 455 disposed at the end of the second section S2.

In one embodiment, the first signal line 522 and the second signal line 524 hardly overlap with each other, but portions thereof overlap at the crossing portion of path change portion PCP. The shape of the crossing portion may be approximately a cross.

In one embodiment, the path change portion PCP of the differential signal line 520 and the path change portion PCP of a neighboring differential signal line 520 are disposed at different positions along their length direction. For example, the path change portion PCP of the differential signal line 520 of the leftmost side that is indicated by "B" in FIG. 5 may face the central portion of the first section S1 of the neighboring differential signal line 520. If the path change portion PCP of the differential signal line 520 and the via hole 455 are disposed in a line, the path change portion PCP and the via holes 455 function as an antenna such that the EMI characteristic may be deteriorated.

Figure 7:
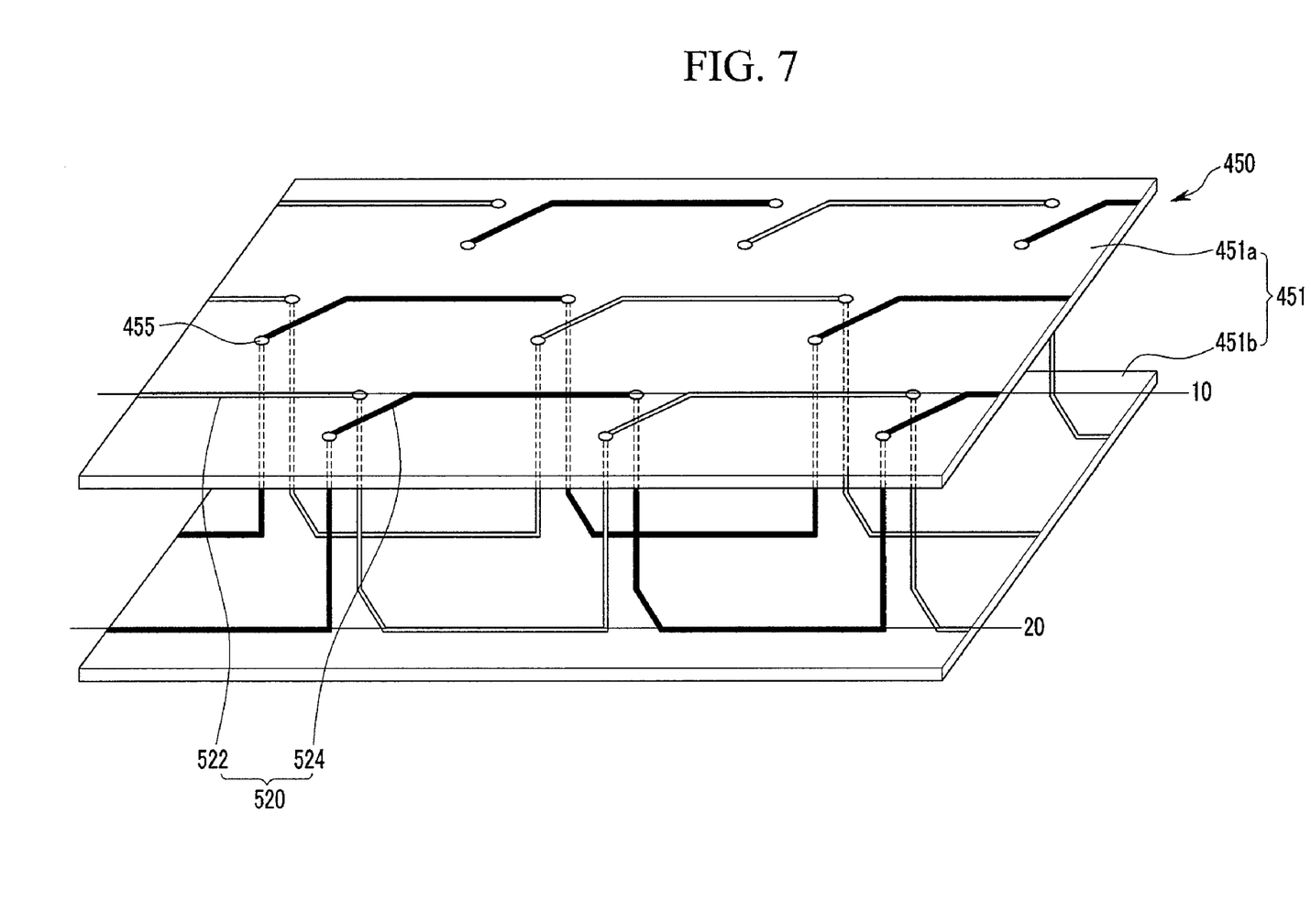
FIG. 7 is an exploded perspective view of a circuit board according to another exemplary embodiment of the present disclosure.

On the other hand, in another embodiment, as shown in FIG. 7, the substrate 451 may have a dual-layered structure including an upper layer 451a and a lower layer 451b. In this case, the first path 10 is disposed on the upper layer 451a and the second path 20 is disposed on the lower layer 451b. The two paths 10 and 20 do not overlap with each other, and are separated from each other along the vertical direction and the length direction L of the differential signal line 520. A plurality of via holes 455 are formed on the upper layer 451a. The remaining structure is the same as the structure shown in FIGS. 5 and 6.

Next, a circuit board according to another exemplary embodiment of the present disclosure will be described in detail with reference to FIG. 8 to FIG. 10. The circuit board according to the present exemplary embodiment may be applied to another display device using a circuit board as well as the above-described display device.

Figure 8:
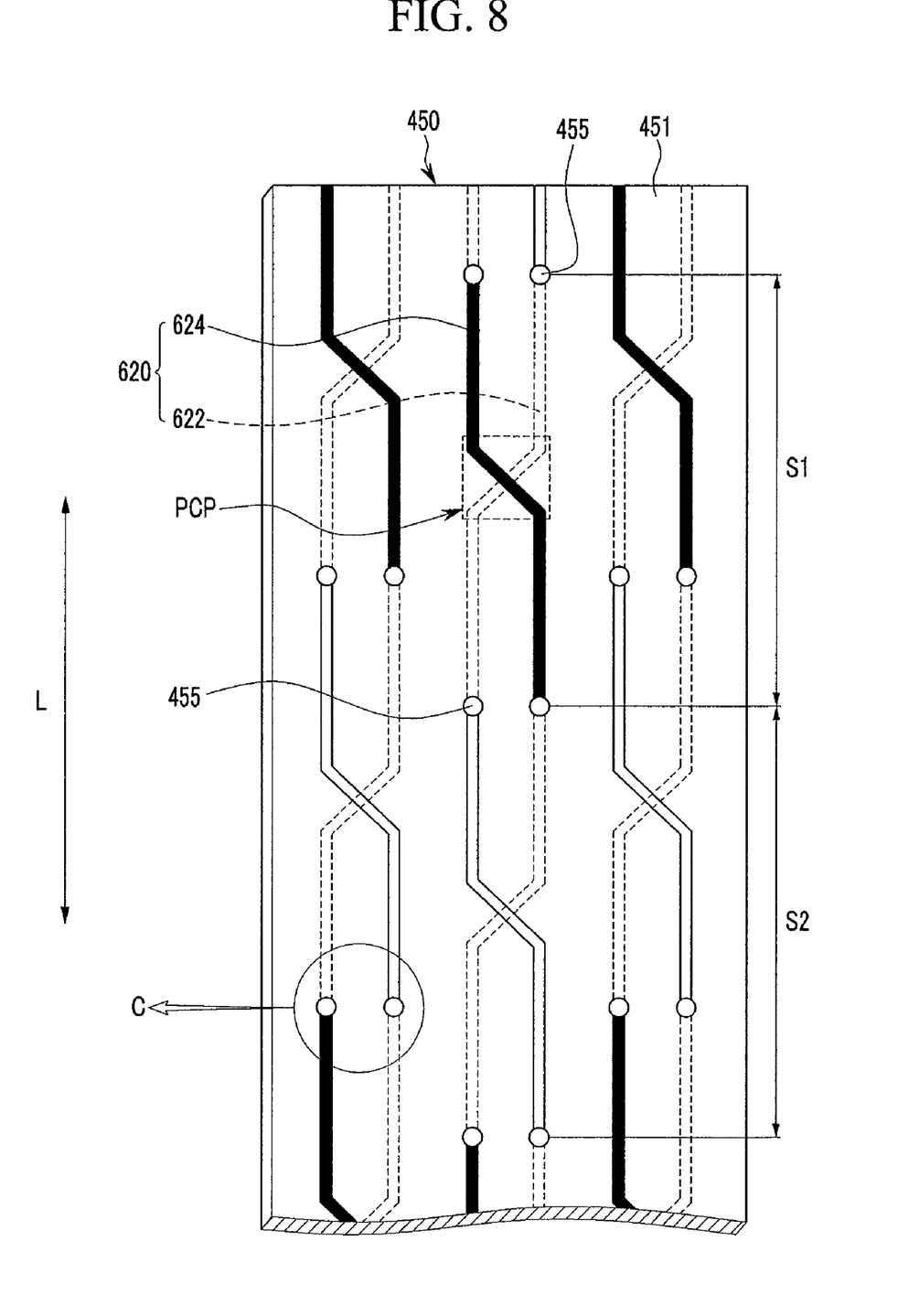
FIG. 8 is a top plan view of an enlarged portion of a circuit board according to another exemplary embodiment of the present disclosure.

FIG. 8 is a top plan view of an enlarged portion of a circuit board according to another exemplary embodiment of the present disclosure. FIG. 9 is an enlarged view of a C portion of FIG. 8. FIG. 10 is an exploded perspective view of a circuit board according to another exemplary embodiment of the present disclosure.

Figure 9:
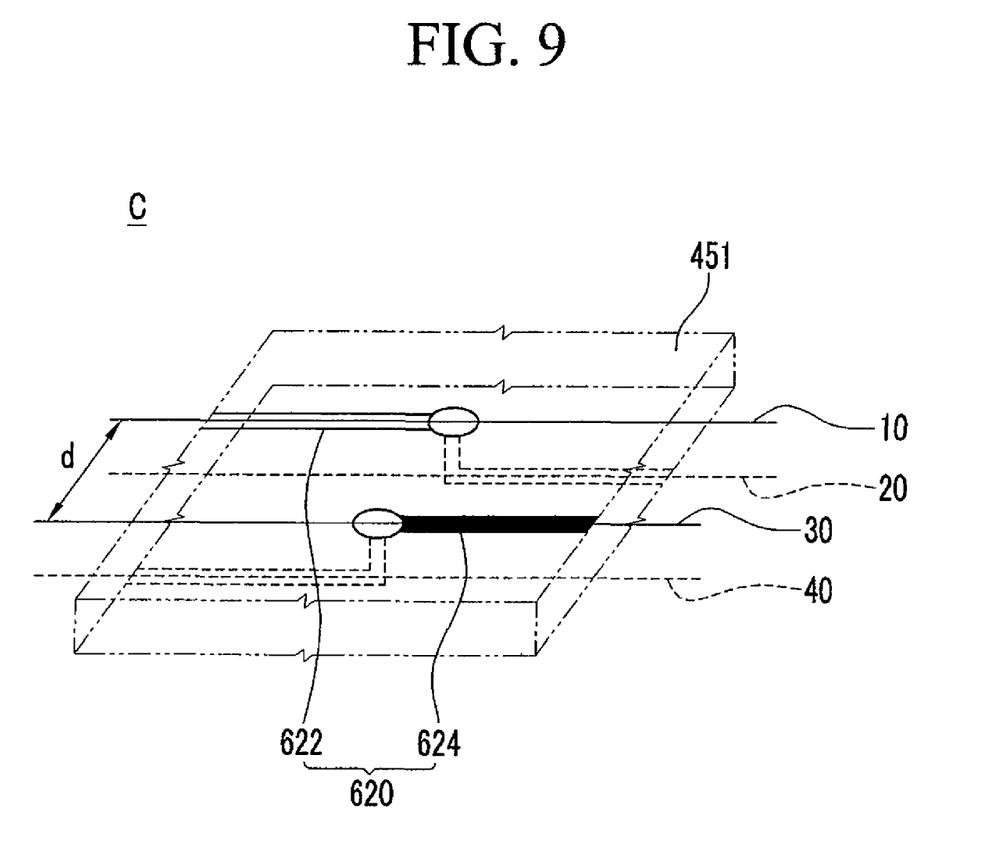
FIG. 9 is an enlarged view of a C portion of FIG. 8.

Referring to FIGS. 8 and 9, a circuit board 450 includes a substrate 451 and a plurality of differential signal lines 620.

The substrate 451, in one embodiment, may be made of phenolic resin or epoxy resin, such that it may be flexible to move and bend. The substrate 451 may be made of a single-layered structure. The plurality of differential signal lines 620 are formed on the substrate 451. One differential signal line 620 includes a first signal line 622 and a second signal line 624. The first signal line 622 and the second signal line 624 extend along the first to fourth paths 10, 20, 30, and 40, and transmits signals having the same amplitude and opposite phases.

In one embodiment, the first path 10 and the third path 30 are disposed on the upper surface of the substrate 451 and are separated from each other by a predetermined interval d. The second path 20 and the fourth path 40 are disposed on the lower surface of the substrate 451 and are separated from each other by a predetermined interval d. The first path 10 and the second path 20 overlap each other, and the third path 30 and the fourth path 40 overlap each other.

The substrate 451, in one embodiment, includes a plurality of via holes 455 disposed on the paths 10, 20, 30, and 40, and the via holes 455 disposed on the first and second paths 10 and 20 face the via holes 455 disposed on the third and fourth paths 30 and 40. The path change portion PCP is a portion where the first and second signal lines 622 and 624 change the paths 10, 20, 30, and 40 in the same surface of the substrate 451, and repeatedly appear along the length direction L of the differential signal line 520.

Differently from the above-described exemplary embodiments, the via holes 455 according to the present exemplary embodiment are separated from the path change portion PCP. As such, the via holes 455 are disposed between two neighboring path change portions PCP in the length direction L of the differential signal line 520. When the interval between two neighboring via holes 455 along the length direction L of the differential signal line 620 is referred to as sections S1 and S2, the distance of the section S1 and S2 may all be the same, or may be different for each section.

When the first signal line 622 and the second signal line 624 are traced along the length direction L, four paths are alternately disposed and the first signal line 622 and the second signal line 624 are positioned on the different paths. The first signal line 622 and the second signal line 624 are traced along the paths 10 and 30 disposed on the upper surface of the substrate 451 or the paths 20 and 40 disposed on the lower surface thereof through the via holes 455, and change the paths 10, 20, 30, and 40 at the path change portion PCP. The planer shape of the portion of the first signal line 622 and the second signal line 624 in the path change portion PCP may be a cross.

Positions of the first and second signal lines 622 and 624 along the direction from the first section S1 to the second section S2 will now be described. The first signal line 622 is traced from the first path 10 to the second path 20 through the via hole 455 disposed at the position where the first section S1 is started, then extends according to the second path 20 to the path change portion PCP, bends toward the fourth path 40 on the path change portion PCP, and extends along the fourth path 40 to the via hole 455 disposed at the end of the first section S1. The first signal line 622 is traced from the fourth path 40 to the third path 30 through the via hole 455 disposed at the position where the first section S1 ends and the second section S2 starts, then extends along the third path 30 to the path change portion PCP, bends toward the first path 10 on the path change portion PCP, and extends along the first path 10 to the via hole 455 disposed at the end of the second section S2.

The second signal line 624 is traced from the fourth path 40 to the third path 30 through the via hole 455 disposed at the portion where the first section S1 starts, then extends along the third path 30 to the path change portion PCP, bends toward the first path 10 on the path change portion PCP, and extends along the first path 10 to the via hole 455 disposed at the end of the first section S1. Also, the second signal line 624 is traced from the first path 10 to the second path 20 through the via hole 455 disposed at the portion where the first section S1 ends and the second section S2 is started, is extended along the second path 20 to the path change portion PCP, bends toward the fourth path 40 on the path change portion PCP, and extends along the fourth path 40 to the via hole 455 disposed at the end of the second section S2.

In one embodiment, the first signal line 522 and the second signal line 524 hardly overlap with each other, but a portion thereof is overlapped at the crossing portion of the path change portion PCP. The shape of the crossing portion may be approximately a cross. The path change portion PCP of the differential signal line 620 and the path change portion PCP of the neighboring differential signal line 620 are disposed at different distances away from an edge of the circuit board 450 along their length. Accordingly, the via hole 455 of the differential signal line 620 and the via hole 455 of the neighboring differential signal line 620 do not face each other. Also, the via hole 455 of the differential signal line 620 and the path change portion PCP of the neighboring differential signal line 620 may be positioned with respect to each other along the length direction of the differential signal line 620. In one embodiment, if the path change portion PCP of the neighboring differential signal line 620 and the via hole 455 are disposed in a line, the path change portion PCP and the via holes 455 function as an antenna such that the EMI characteristic may be deteriorated.

Figure 10:
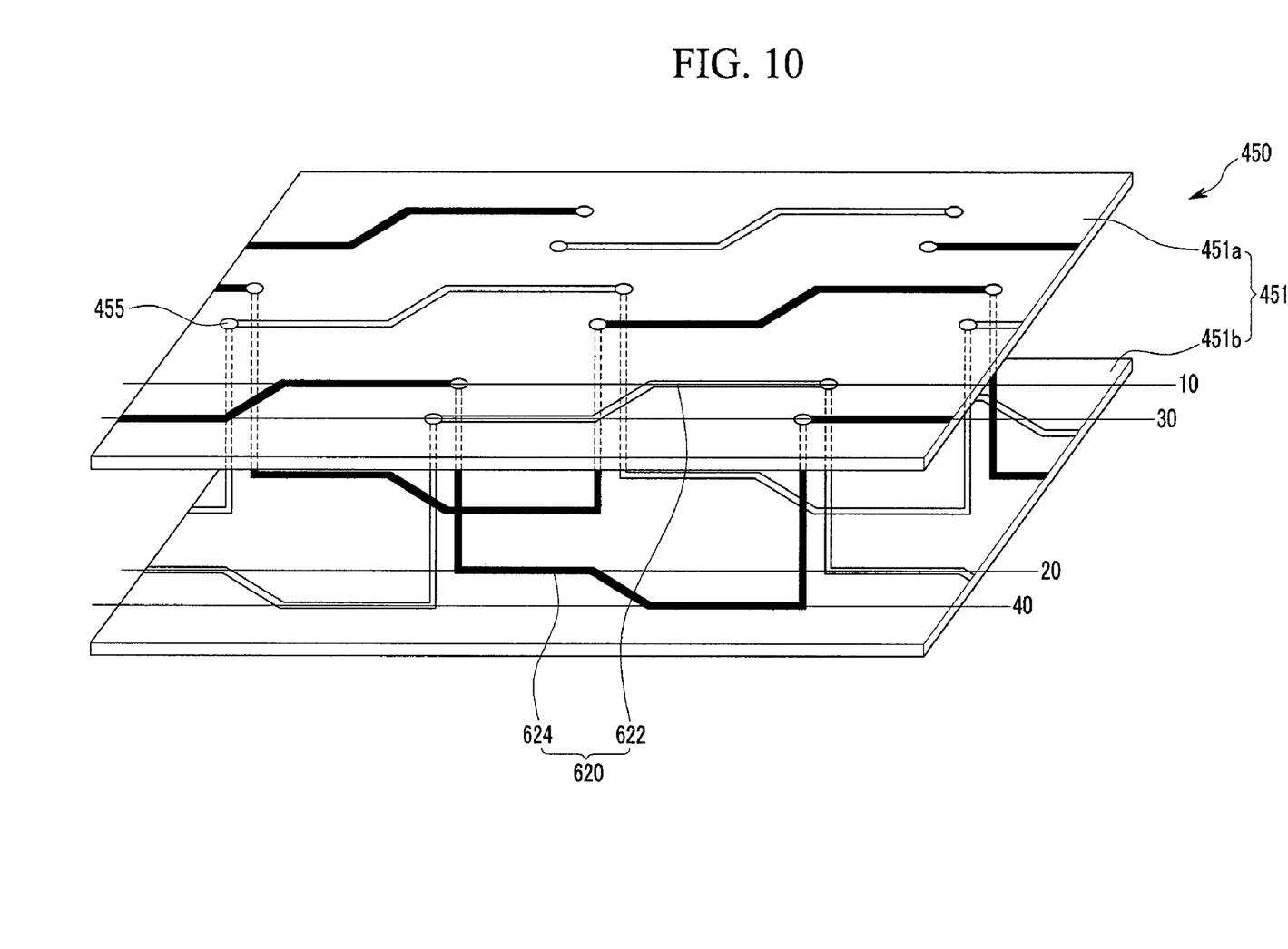
FIG. 10 is an exploded perspective view of a circuit board according to another exemplary embodiment of the present disclosure.

On the other hand, in another embodiment, as shown in FIG. 10, the substrate 451 may have a dual-layered structure including an upper layer 451a and a lower layer 451b. In this case, the first path 10 and the third path 30 are disposed in the upper layer 451a, and the second path 20 and the fourth path 40 are disposed in the lower layer 451b. The upper layer 451a includes a plurality of via holes 455. The remaining structure is almost the same as the structure shown in FIGS. 8 and 9.

While the present disclosure has been described in connection with what is presently considered to be practical exemplary embodiments, it is to be understood that the present disclosure is not limited to the disclosed embodiments, but, on the contrary, is intended to cover various modifications and equivalent arrangements included within the spirit and scope of the appended claims.

What is claimed is:

1. A circuit board comprising:
   a substrate; and
   a plurality of differential signal lines formed on the substrate and transmitting differential signals,
   wherein the differential signal lines respectively include a first signal line and a second signal line, and
   wherein the first signal line and the second signal line extend along at least two paths that are parallel to each other, and
   wherein the paths of the first signal line and the second signal line switch at path change portions, and
   wherein path change portions of neighboring differential signal lines are positioned at different distances away from an edge of the circuit board along the length direction of the differential signal lines.

2. The circuit board of claim 1, wherein the substrate includes a first surface and a second surface, and
   wherein the paths include a first path disposed on the first surface and a second path disposed on the second surface, and
   wherein one side of the first signal line is disposed on the first path and the other side of the first signal line is disposed on the second path with respect to the path change portion, and
   wherein the second signal line is disposed to avoid overlapping the first signal line outside the path change portions.

3. The circuit board of claim 2, wherein the substrate includes a pair of via holes disposed at the path change portions, and wherein the first signal line and the second signal line are changed from the first path to the second path through the via holes.

4. The circuit board of claim 3, wherein the first path and the second path overlap each other.

5. The circuit board of claim 4, wherein the via holes are separated from the first path and the second path.

6. The circuit board of claim 5, wherein the pair of via holes are separated from and opposite to the other side with reference to the first and second paths.

7. The circuit board of claim 6, wherein the portion of the first signal line and the portion of the second signal line disposed at the path change portion form a substantially rhombic outline.

8. The circuit board of claim 1, wherein the substrate is made of a dual-layered structure including an upper layer and a lower layer, and
   wherein the path includes a first path disposed on the upper layer and a second path disposed on the lower layer, and
   wherein one portion of the first signal line is disposed in the first path and the other portion of the first signal line is disposed in the second path, and
   wherein the second signal line is disposed on a different path than the first signal line outside the path change portion.

9. The circuit board of claim 8, wherein the upper layer includes a pair of via holes disposed at the path change portion, and wherein the paths of the first and second signal lines switch between the upper layer and the lower layer through the via holes.

10. The circuit board of claim 1, wherein the substrate and the differential signal line are flexible.

* * * * *